(12) United States Patent
Marutani (10) Patent No.: US 10,790,426 B2
(45) Date of Patent: Sep. 29, 2020

(54) METHOD OF MANUFACTURING LIGHT EMITTING ELEMENT MOUNTING BASE MEMBER, METHOD OF MANUFACTURING LIGHT EMITTING DEVICE USING THE LIGHT EMITTING ELEMENT MOUNTING BASE MEMBER, LIGHT EMITTING ELEMENT MOUNTING BASE MEMBER, AND LIGHT EMITTING DEVICE USING THE LIGHT EMITTING ELEMENT MOUNTING BASE MEMBER

(71) Applicant: NICHIA CORPORATION, Anan-shi (JP)

(72) Inventor: Yukitoshi Marutani, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/475,162

(22) Filed: Mar. 31, 2017

(65) Prior Publication Data
US 2017/0288106 A1    Oct. 5, 2017

(30) Foreign Application Priority Data

Apr. 1, 2016    (JP) ................................ 2016-074774
Mar. 27, 2017    (JP) ................................ 2017-061241

(51) Int. Cl.
*H01L 33/00*    (2010.01)
*H01L 33/62*    (2010.01)
(Continued)

(52) U.S. Cl.
CPC .............. *H01L 33/62* (2013.01); *H01L 25/13* (2013.01); *H01L 25/50* (2013.01); *H01L 33/00* (2013.01);
(Continued)

(58) Field of Classification Search
CPC ................................ H01L 33/52; H01L 33/62
(Continued)

(56) References Cited

U.S. PATENT DOCUMENTS 4,791,248 A * 12/1988 Oldenettel ............. H05K 1/056
                                                 174/265
5,220,135 A *  6/1993 Kawakami ........... H05K 1/0218
                                                 174/255
(Continued)

FOREIGN PATENT DOCUMENTS

JP    6-302864    10/1994
JP    10-193020    7/1998
(Continued)

OTHER PUBLICATIONS

Extended European Search Report for corresponding EP Application No. 17164316.6-1551, dated Aug. 1, 2017.

*Primary Examiner* — Jay C Kim
(74) *Attorney, Agent, or Firm* — Mori & Ward, LLP (57) ABSTRACT

A method of manufacturing a light emitting element mounting base member includes: arranging a plurality of core members each including an electrical conductor core and a light-reflecting insulating member provided on a surface of the electrical conductor core; integrally holding the core members with a light blocking resin; and partially removing the insulating members such that at least one surface of the electrical conductor cores is exposed from the light blocking resin.

4 Claims, 7 Drawing Sheets

(51) Int. Cl.
*H01L 33/64* (2010.01)
*H01L 25/13* (2006.01)
*H01L 25/00* (2006.01)
*H01L 33/52* (2010.01)
*H01L 33/58* (2010.01)
*H01L 33/60* (2010.01)

(52) U.S. Cl.
CPC ............. *H01L 33/52* (2013.01); *H01L 33/58* (2013.01); *H01L 33/60* (2013.01); *H01L 33/647* (2013.01); *H01L 2933/005* (2013.01); *H01L 2933/0033* (2013.01); *H01L 2933/0058* (2013.01); *H01L 2933/0066* (2013.01); *H01L 2933/0075* (2013.01)

(58) Field of Classification Search
USPC ............................................. 257/98; 438/26
See application file for complete search history.

(56) References Cited

U.S. PATENT DOCUMENTS

| | | | | |
|---|---|---|---|---|
| 5,231,751 | A * | 8/1993 | Sachdev | H01L 21/486 216/18 |
| 5,374,788 | A * | 12/1994 | Endoh | H05K 1/056 174/255 |
| 5,976,974 | A * | 11/1999 | Fischer | H01L 21/4846 438/129 |
| 6,009,620 | A * | 1/2000 | Bhatt | H05K 3/0094 29/846 |
| 6,045,240 | A * | 4/2000 | Hochstein | B60Q 1/2696 362/294 |
| 6,204,453 | B1 * | 3/2001 | Fallon | H05K 3/44 174/255 |
| 6,221,769 | B1 * | 4/2001 | Dhong | H01L 21/486 257/E21.597 |
| 6,248,958 | B1 * | 6/2001 | McClure | H05K 1/056 174/255 |
| 6,365,844 | B2 * | 4/2002 | Nishii | H05K 3/0032 174/264 |
| 6,498,381 | B2 * | 12/2002 | Halahan | H01L 21/76898 257/244 |
| 6,518,515 | B2 * | 2/2003 | Nishii | H05K 3/0032 174/262 |
| 6,620,731 | B1 * | 9/2003 | Farnworth | H01L 21/486 257/E21.511 |
| 6,645,607 | B2 * | 11/2003 | Curcio | H05K 3/462 174/259 |
| 6,660,381 | B2 * | 12/2003 | Halas | B22F 1/0018 252/478 |
| 6,711,812 | B1 * | 3/2004 | Lu | H01L 23/3677 174/262 |
| 6,783,569 | B2 * | 8/2004 | Cheon | B01J 13/02 75/348 |
| 6,820,330 | B1 * | 11/2004 | Haba | H05K 3/445 29/825 |
| 6,878,871 | B2 * | 4/2005 | Scher | B82Y 10/00 136/252 |
| 7,229,690 | B2 * | 6/2007 | Chan | B01J 13/02 428/403 |
| 7,316,063 | B2 * | 1/2008 | Farnworth | H01L 21/486 174/250 |
| 7,393,618 | B2 * | 7/2008 | Ioku | C09K 11/62 252/301.36 |
| 7,659,224 | B2 * | 2/2010 | Shimazaki | B01J 23/42 420/460 |
| 7,695,150 | B2 * | 4/2010 | Dejima | G02B 6/0023 313/467 |
| 7,733,310 | B2 * | 6/2010 | Hajjar | B82Y 10/00 345/84 |
| 7,800,002 | B2 * | 9/2010 | Chujo | H01L 21/486 174/262 |
| 7,918,020 | B2 * | 4/2011 | Chujo | H01L 21/486 205/125 |
| 7,972,031 | B2 * | 7/2011 | Ray | G09F 9/33 174/261 |
| 8,133,768 | B2 * | 3/2012 | Ray | G09G 3/32 257/E21.006 |
| 8,137,759 | B2 * | 3/2012 | Zhang | B82Y 10/00 422/68.1 |
| 8,143,532 | B2 * | 3/2012 | Zhang | H05K 3/0055 174/260 |
| 8,148,263 | B2 * | 4/2012 | Sinha | H01L 21/76898 438/667 |
| 8,158,983 | B2 * | 4/2012 | Beeson | H01L 25/0753 257/291 |
| 8,198,551 | B2 * | 6/2012 | Japp | H05K 3/4641 174/262 |
| 8,343,575 | B2 * | 1/2013 | Dubrow | C09K 11/025 156/60 |
| 8,749,009 | B2 * | 6/2014 | Young | H01L 31/0481 257/439 |
| 8,889,216 | B2 * | 11/2014 | Ray | H01L 27/3281 427/66 |
| 9,134,459 | B2 * | 9/2015 | Linton | G02B 1/002 |
| 9,303,153 | B2 * | 4/2016 | Nick | C08K 13/02 |
| 9,332,632 | B2 * | 5/2016 | Schneider | B32B 9/007 |
| 9,368,549 | B1 * | 6/2016 | Oraw | H01L 27/156 |
| 9,428,680 | B2 * | 8/2016 | Zambova | C08L 83/04 |
| 9,447,308 | B2 * | 9/2016 | Albaugh | C08K 9/10 |
| 9,905,740 | B2 * | 2/2018 | Shirahama | H01L 33/486 |
| 9,953,792 | B2 * | 4/2018 | Yoneda | H01H 61/02 |
| 2002/0132450 | A1 | 9/2002 | Nose | |
| 2009/0095969 | A1 | 4/2009 | Kotani et al. | |
| 2011/0133232 | A1 | 6/2011 | Yoshioka et al. | |
| 2014/0008676 | A1 * | 1/2014 | Wang | H01L 51/5262 257/98 |
| 2015/0228872 | A1 | 8/2015 | Nagano | |
| 2016/0014878 | A1 * | 1/2016 | Kilhenny | H01L 23/142 257/99 |
| 2016/0091180 | A1 | 3/2016 | Nagano | |
| 2016/0107145 | A1 * | 4/2016 | Okazaki | B01J 23/30 502/309 |
| 2016/0370526 | A1 * | 12/2016 | Kim | G02B 6/005 |
| 2017/0033073 | A1 * | 2/2017 | Ghoshal | B23K 35/025 |
| 2017/0229619 | A1 * | 8/2017 | Mclaughlin | C09K 11/025 |

FOREIGN PATENT DOCUMENTS

| | | |
|---|---|---|
| JP | 2002-270711 | 9/2002 |
| JP | 2002-270724 | 9/2002 |
| JP | 2002-270725 | 9/2002 |
| JP | 2002-270726 | 9/2002 |
| JP | 2002-314245 | 10/2002 |
| JP | 2007-27157 | 2/2007 |
| JP | 2007-214162 | 8/2007 |
| JP | 2007-227737 | 9/2007 |
| JP | 2007-273602 | 10/2007 |
| JP | 2007-273603 | 10/2007 |
| JP | 2008-235469 | 10/2008 |
| JP | 2010-135718 | 6/2010 |
| JP | 2010-186022 | 8/2010 |
| JP | 2011-222830 | 11/2011 |
| JP | 2015-111620 | 6/2015 |
| WO | WO 2011/129313 | 10/2011 |

* cited by examiner

METHOD OF MANUFACTURING LIGHT EMITTING ELEMENT MOUNTING BASE MEMBER, METHOD OF MANUFACTURING LIGHT EMITTING DEVICE USING THE LIGHT EMITTING ELEMENT MOUNTING BASE MEMBER, LIGHT EMITTING ELEMENT MOUNTING BASE MEMBER, AND LIGHT EMITTING DEVICE USING THE LIGHT EMITTING ELEMENT MOUNTING BASE MEMBER

CROSS-REFERENCE TO RELATED APPLICATION

This application claims priority to Japanese Patent Application No. 2016-074,774, filed on Apr. 1, 2016 and Japanese Patent Application No. 2017-061,241, filed on Mar. 27, 2017, the contents of which are hereby incorporated by reference in their entirety.

BACKGROUND

1. Field of the Invention

The present disclosure relates to a method of manufacturing a light emitting element mounting base member, a method of manufacturing a light emitting device using the light emitting element mounting base member, a light emitting element mounting base member, and a light emitting device using the light emitting element mounting base member.

2. Discussion of the Background

As light sources of various kinds, a light emitting device that incorporates a light emitting element such as a light emitting diode (LED) chip is used. One of these light emitting devices includes a light emitting element and a base member on which the light emitting element is mounted. For example, Japanese Unexamined Patent Publication No. 2008-235469 and Japanese Unexamined Patent Publication No. 2010-135718 describe light emitting devices using light emitting elements mounted in an assembly of light emitting device housings in which a lead frame obtained by processing a metal sheet by punching, etching or other methods is integrated with a resin using an insert molding technique.

A process of forming the lead frames in manufacturing an assembly of light emitting device housings necessitates punching or etching, which generates a large amount of wastes and waste liquid, thereby leading an increase in costs of the lead frames, and consequently in costs of the ultimately manufactured light emitting device.

The present aspects have been made in view of the above-mentioned circumstances, and an object thereof is to provide a method of manufacturing a light emitting element mounting base member with a reduced cost, a method of manufacturing a light emitting device using the light emitting element mounting base member, a light emitting element mounting base member, and a light emitting device using the light emitting element mounting base member.

SUMMARY

A method of manufacturing a light emitting element mounting base member according to one aspect of the present disclosure includes: arranging a plurality of core members each including an electrical conductor core and a light-reflecting insulating member provided on a surface of the electrical conductor core; integrally holding the core members with a light blocking resin; and partially removing the insulating members such that at least one surface of each of the electrical conductor cores is exposed from the light blocking resin.

Further, a light emitting element mounting base member according to one aspect of the present disclosure includes: a plurality of electrical conductor cores; a plurality of light-reflecting insulating members that each cover a lateral surface of each of the electrical conductor cores; and a light blocking resin that joins the at least two insulating members, wherein at least one upper surface of the electrical conductor cores, at least one lower surface of the electrical conductor cores, and the at least one insulating member disposed around the upper surfaces and the lower surfaces of each of the electrical conductor cores are exposed from the light blocking resin.

A cost reduction can be achieved according to the method, the light emitting element and the mounting base member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Hereinafter, embodiments of the present disclosure will be described with reference to the drawings as necessary. It is to be noted that a light emitting element mounting base member and a method of manufacturing a light emitting element mounting base member as described below is intended to implement the technical concept of the present disclosure, and the present disclosure is not limited to the following unless otherwise specified. Further, the description provided in one embodiment or example is applicable to other embodiment or example. In the description of the structure of other embodiment, identical or similar members are denoted by identical names, and their detailed descriptions are omitted as appropriate. The sizes, positional relations and so on of members shown in the drawings may be exaggerated for clarification of explanations.

First Embodiment

A method of manufacturing a light emitting element mounting base member 100 according to a first embodiment includes: arranging a plurality of core members 16 each including an electrical conductor core 12 and a light-reflecting insulating member 14 provided on the surface of the electrical conductor core 12; and integrally holding the core members 16 with a light blocking resin 20. Hereinafter, a description will be given of the method of manufacturing the light emitting element mounting base member according to the present embodiment with reference to FIGS. 1A to 6, 12 and 13.

Arranging Core Members 16

Figure 2:
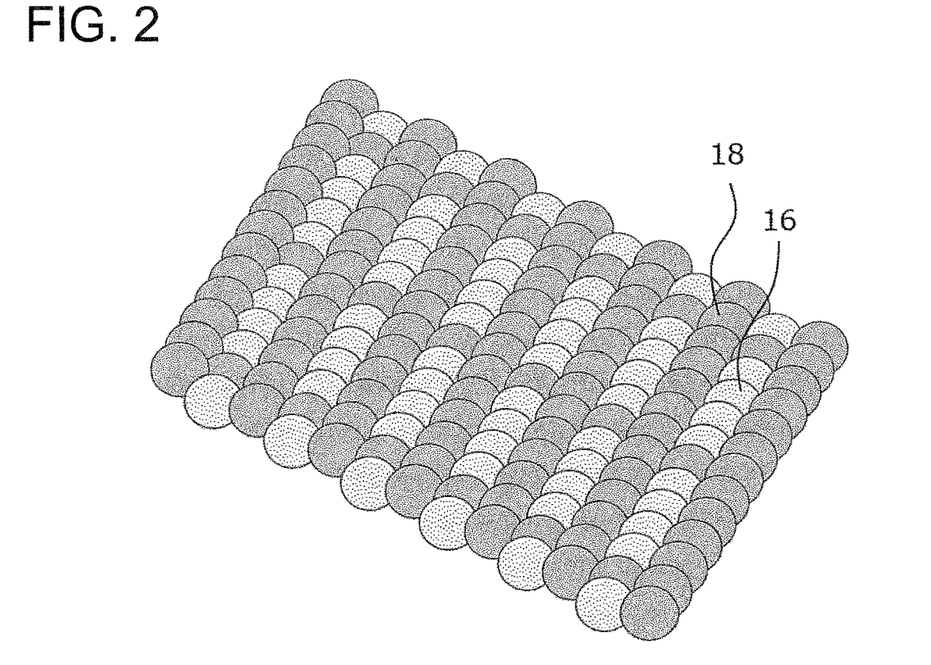
FIG. 2 is a schematic diagram illustrating a manufacturing method according to a first embodiment of the present disclosure.

As shown in FIG. 2, the spherical core members 16 are arranged. Here, spherical insulating spacer members 18 each having substantially the same size as the core member 16 are used to adjust the positions of the core members 16. Specifically, a row in which one insulating spacer member 18 is disposed between core member sets each formed by a plurality of (four in FIG. 2) core members 16 arranged in line, and a row in which just a plurality of insulating spacer members 18 are disposed, are alternately repetitively disposed. The core members 16 and the core member sets are used as electrodes of light emitting devices 200. Therefore, the core members 16 or the core member sets are provided, for example, by several tens to several thousands in number depending on the number of the light emitting devices 200 that are produced using the light emitting element mounting base member 100. The core members may be arranged in a one-dimensional array, a two-dimensional array, or a three-dimensional array in which the core members are layered.

Figure 1A:
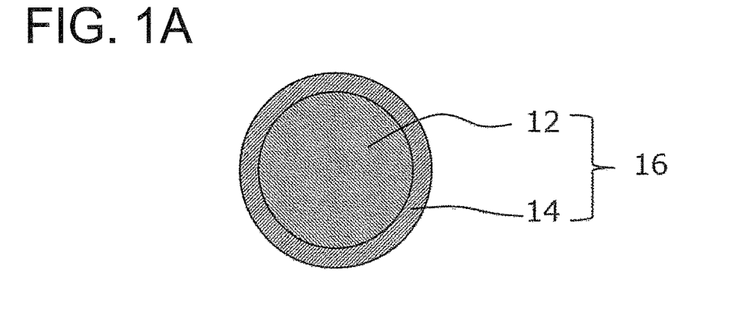
FIG. 1A is a schematic cross-sectional view showing a core member.

As shown in FIG. 1A, the core member 16 has the light-reflecting insulating member 14 on the entire surface of the spherical electrical conductor core 12. The electrical conductor core 12 may have a shape other than a sphere, and preferably has a shape that allows an insulating member to be easily formed on the surface. The size of the electrical conductor core 12 can be selected as appropriate depending on the size of a light emitting element 24 to be mounted, and the size of the light emitting device 200 obtained in the present embodiment. For example, when the electrical conductor core 12 is spherical shape, it may have a diameter in a range of about 0.1 mm to about 2.0 mm.

The light-reflecting insulating member 14 is formed on the entire surface of the electrical conductor core 12 by, for example, repeating the following step a required number of times: spray-coating the entire surface of the electrical conductor core 12 with the light-reflecting insulating member 14 and baking the light-reflecting second insulating member 14. The thickness of the light-reflecting insulating member 14 may be, for example, about 0.01 to 0.1 mm.

Figure 1B:
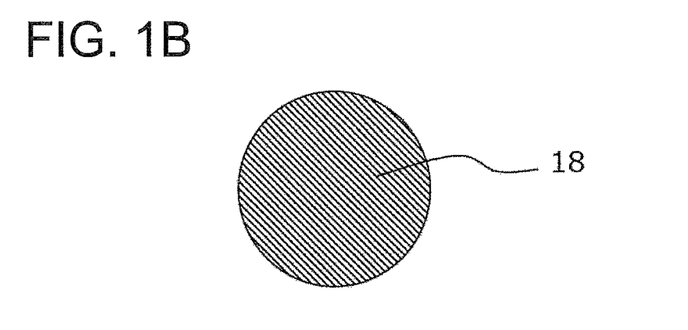
FIG. 1B is a schematic cross-sectional view showing an insulating spacer member.

As shown in FIG. 1B, the insulating spacer member 18 is preferably entirely made of an insulating material. Further, the size and shape of the insulating spacer member 18 are preferably substantially identical to those of the employed core member.

Joining Core Members 16

The core members 16 and the insulating spacer members 18 arranged as shown in FIG. 2 are joined at portions in contact to one another with an adhesive agent or the like. Thus, a core member assembly in which the core members are joined to each other or the core members and the insulating spacer member 18 are joined to each other is formed. The core members 16 and the insulating spacer members 18 can be held in a light blocking resin forming operation which will be described later, and therefore this joining can be omitted in the case where a tentatively fixing jig is used.

Forming Light Blocking Resin

Figure 3:
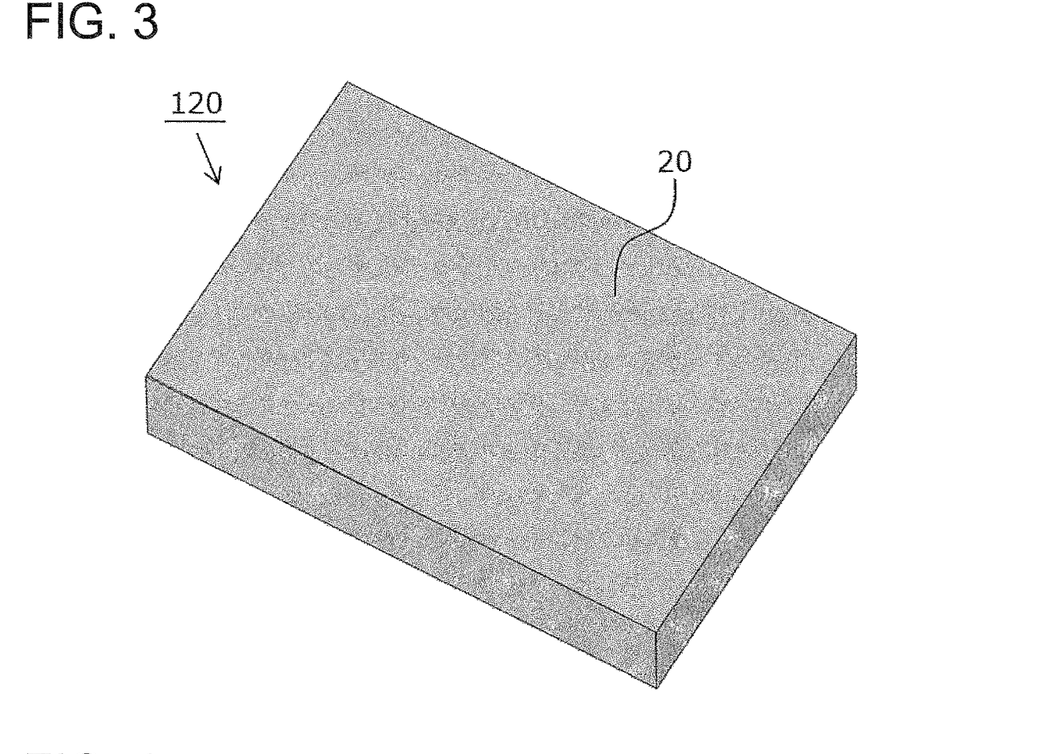
FIG. 3 is a schematic diagram illustrating the manufacturing method according to the first embodiment of the present disclosure.

Subsequently, a light blocking resin composition is injected into the mold to form a light blocking resin with a mold that has a substantially rectangular parallelepiped-shaped cavity so as to cover the core member assembly. Thus, as shown in FIG. 3, a substantially rectangular parallelepiped-shape of a base member preparatory body 120 is obtained in which the core member assembly is completely enclosed in the light blocking resin 20. A runner and a gate of the mold should be provided as appropriate. Thus, the plurality of core members 16 and the insulating spacer members 18 are integrally held with the light blocking resin 20. At this time, because the light blocking resin composition can be fed into a space among the core members 16 and the insulating spacer members 18, thereby allowing the light blocking resin 20 to be easily molded. By virtue of the core members 16 and the insulating spacer members 18 being spherical, the shape of the space between them is complicated. This improves adhesion between the core members 16 or the insulating spacer members 18 and the light blocking resin 20.

Exposing Electrical Conductor Cores

Subsequently, the obtained base member preparatory body 120 has a thickness reduced to a predetermined degree by grinding or polishing performed at its upper and lower surfaces. Thereafter, the at least one electrical conductor core 12 are partially exposed from each of the insulating members 14 and the light blocking resin 20 at an upper surface and a lower surface of the base member preparatory body. Thus, the electrical conductor cores 12, the insulating members 14 and the light blocking resin 20 are disposed substantially flush with one another at the upper and lower surfaces of the base member preparatory body.

Figure 4:
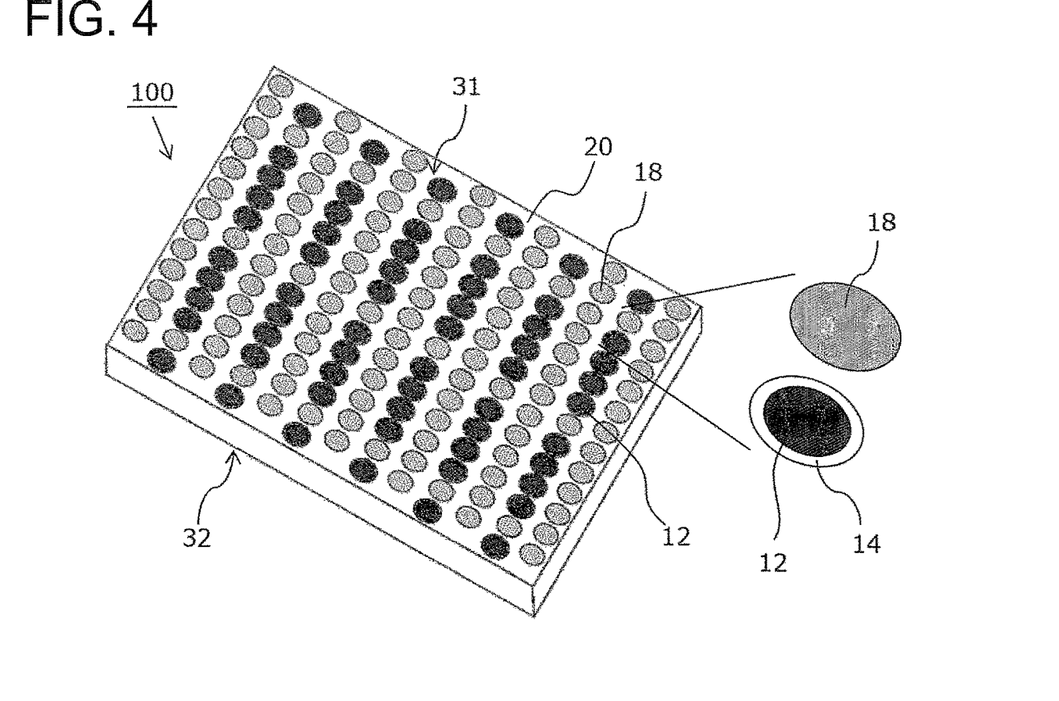
FIG. 4 is a schematic diagram illustrating the manufacturing method according to the first embodiment of the present disclosure.
Figure 12:
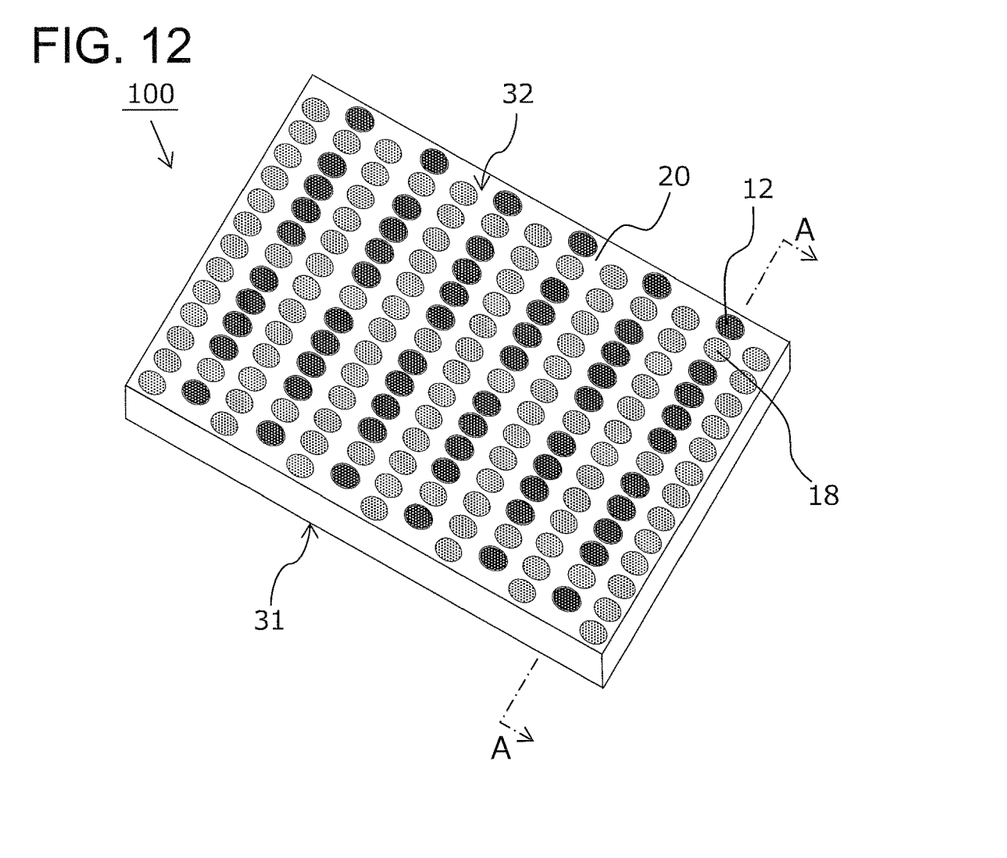
FIG. 12 is a schematic diagram illustrating a bottom view of the first embodiment of the present disclosure shown in FIG. 4.
Figure 13:
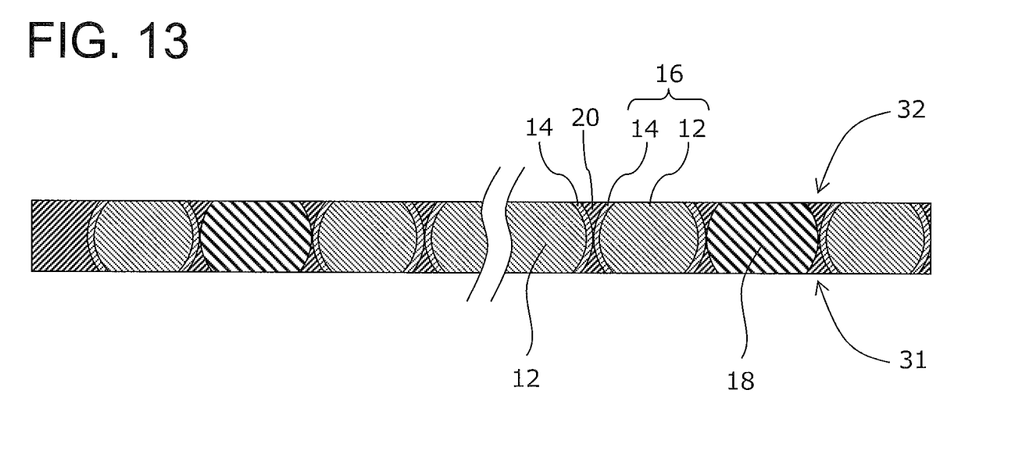
FIG. 13 is a schematic diagram illustrating a cross-sectional view taken along an A-A line of FIG. 12.

This provides, as shown in FIGS. 4, 12, and 13, the light emitting element mounting base member 100 that includes: a plurality of electrical conductor cores 12; the light-reflecting insulating members 14 that each cover the lateral surface of each of the electrical conductor cores 12; and the light blocking resin 20 that joins the at least two insulating members 14, and in which the electrical conductor cores 12 are exposed outside the upper and lower surfaces of the light blocking resin 20. The light blocking resin 20 and the insulating members 14 are removed until the electrical conductor cores 12 are partially exposed, therefore, the core members 16 may not be completely enclosed in the light blocking resin 20 in molding the light blocking resin 20 of the base member preparatory body 120. For example, the top of the core member 16 may be exposed from the light blocking resin 20.

Forming Metal Films

Figure 5:
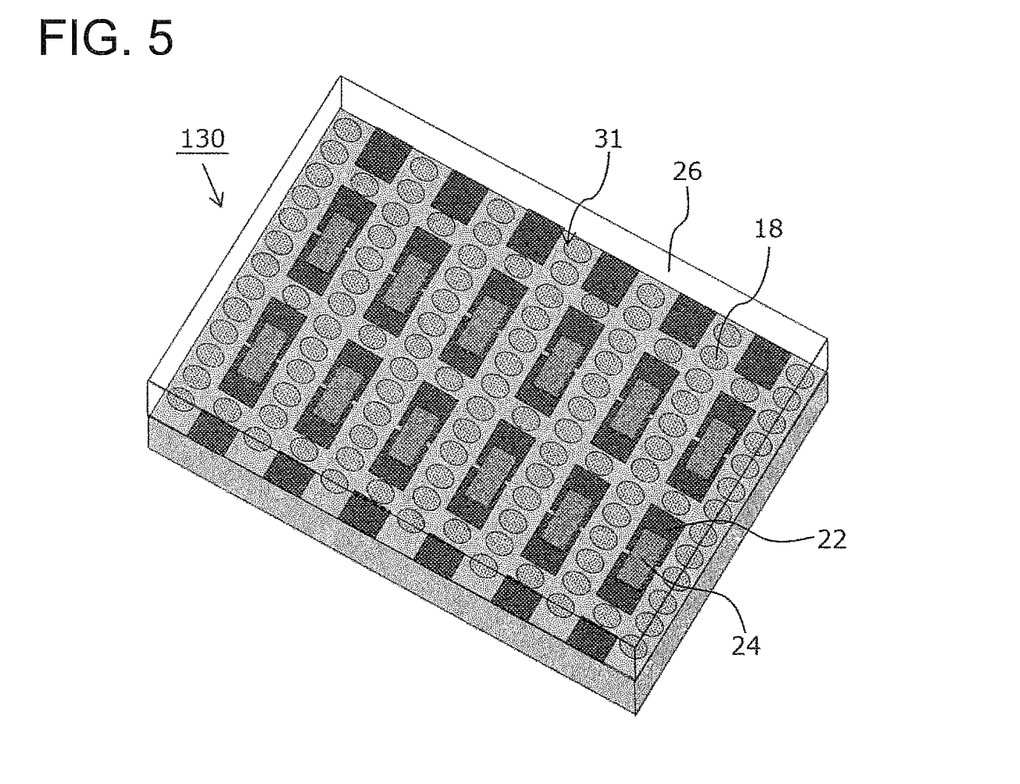
FIG. 5 is a schematic diagram illustrating the manufacturing method according to the first embodiment of the present disclosure.

Metal films 22 may be formed at the exposed portions of the electrical conductor cores 12 of the light emitting element mounting base member 100 by plating or sputtering. In the present embodiment, as shown in FIG. 5, each of the metal films 22 is formed on the exposed surfaces of the electrical conductor cores 12, the exposed surfaces of the insulating members 14, and the surface of the light blocking resin 20 to connect the exposed surfaces of a plurality of electrical conductor cores 12. Specifically, two metal films 22 are disposed with respect to each core member set formed by the plurality of core members 16, four core members 16 in the present embodiment, arranged in line. That is, one metal film 22 is formed for two core members. The metal films 22 are disposed to be spaced apart from one another. Because the metal films 22 are connected to the light emitting elements 24 or to the outside of the light emitting device via a connection terminal (e.g., connectors) or the like, the metal films 22 are preferably made of a material that is highly electrically conductive and/or capable of establishing good mechanical and electrical connection. A material having high light-reflecting property, for example, silver is used for the metal film 22 on the upper surface side, in other words, a surface on which the light emitting elements 24 are to be mounted. The metal films may not be formed on all the exposed surfaces of the electrical conductor cores, and need only be formed on necessary areas.

Mounting Light Emitting Element

A plurality of light emitting elements are mounted on the upper surface of a metal film-equipped light emitting element mounting base member obtained as described above. In the present embodiment, the light emitting elements 24 each including a pair of positive and negative electrodes on one surface thereof are flip-chip-mounted on the upper surface of the light emitting element mounting base member 100 while the surfaces of the light emitting elements 24 including the electrodes are situated on the light emitting element mounting base member 100 side. At this time, one metal film 22 and the positive or negative electrode of one of the light emitting elements 24 are electrically connected to each other. The electrical connection between the light emitting element mounting base member 100 and the light emitting elements 24 may be performed using solder, anisotropic conductive paste or the like.

Encapsulating Light Emitting Elements

As shown in FIG. 5, the light emitting elements 24 and the upper surface 31 of the light emitting element mounting base member 100 (where the light emitting elements are mounted) are encapsulated by being covered with an encapsulating member 26 to form a light emitting device assembly 130.

In the present embodiment, an enlarged area of the light emitting element mounting base member can increase the number of light emitting elements that are collectively undergone processes such as mounting and encapsulating the light emitting elements. Accordingly, manufacturing costs can be reduced.

Singulating

Figure 6:
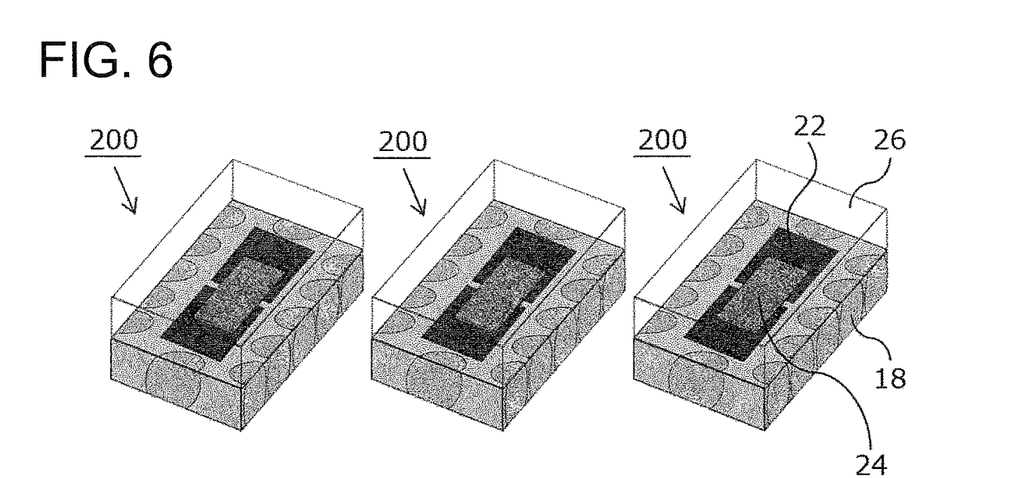
FIG. 6 is a schematic diagram illustrating a light emitting device according to the first embodiment of the present disclosure.

The light emitting device assembly 130 is cut and/or divided along predetermined cutting/dividing lines and thus singulated, so that each resultant piece includes at least two core members. Thus, the light emitting devices 200 shown in FIG. 6 are obtained. The cutting/dividing lines are preferably provided at positions where the electrical conductor cores 12 are not to be cut. For example, the cutting/dividing lines are preferably provided at the positions where a plurality of insulating spacer members 18 are cut along the rows where only the light blocking resin 20 and/or a plurality of insulating spacer members 18 are disposed. When a proportion of the metal members is high with respect to other members on the cutting/dividing lines for dividing and singulating the light emitting device assembly 130, cost of singulation is increased. For example, in the case where the light emitting device assembly 130 is punched with a mold or cut with a dicing blade, the cutting tool wears out faster with metals than with resin. Further, breaking is difficult with a metal member. In the present embodiment, the electrical conductor cores 12 previously separated are integrally held to use as the light emitting element mounting base member 100, so that singulation can be performed without cutting the metal material. Accordingly, cutting can be performed at a high speed, and wear of the cutting blade is reduced, so that productivity can be improved.

By using the previously separated spherical electrical conductor cores 12, the resulting light emitting element mounting base member 100 can be easily produced with a great area.

Further, the light emitting device 100 preferably has a structure that the electrical conductor cores 12 immediately below the light emitting elements 24 are each covered with the light-reflecting insulating members 14 with the metal films 22 being formed thereon, because the heat dissipation path (i.e., the electrical conductor cores 12 positioned directly below the light emitting elements 24) and the current flow path (i.e., the electrical conductor cores 12 electrically connected to the metal films 22 outside the light emitting elements 24) are easily designed to be separated from each other.

Second Embodiment

Figure 7:
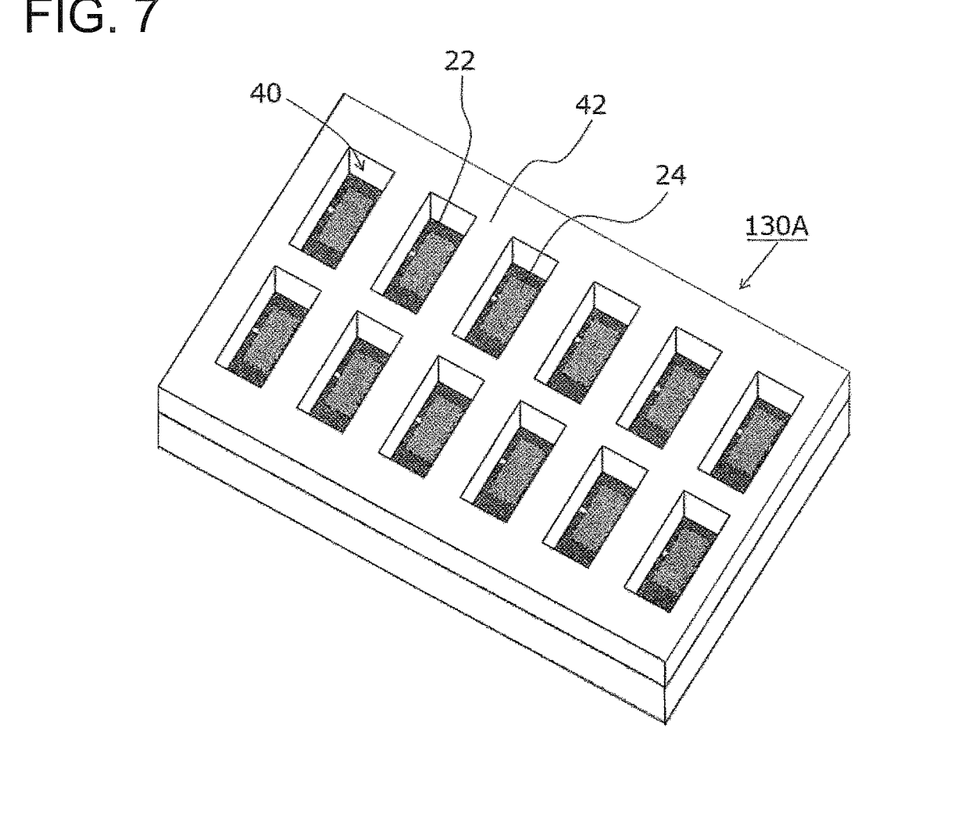
FIG. 7 is a schematic diagram illustrating a manufacturing method according to a second embodiment of the present disclosure.

After the light emitting element mounting base member 100 is produced in a similar manner to the first embodiment, a reflector that is capable of reflecting light emitted by the light emitting element 24 may be formed on or above the upper surface 31 of the light emitting element mounting base member 100. For example, as shown in FIG. 7, a reflector 42 is formed using a mold to expose the metal films 22 of the metal film-equipped light emitting element mounting base member at the bottom surface of recesses 40. Alternatively, the reflector 42 may be obtained by providing a plate-like member that has a plurality of through holes, and joining the plate-like member to the upper surface 31. The metal films 22 may be formed after the reflector 42 is formed.

Thereafter, in a similar manner to the first embodiment, the light emitting elements 24 are mounted and the encapsulating member 26 is embedded in the recess 40. Thus, a light emitting device assembly 130A is formed.

Figure 8:
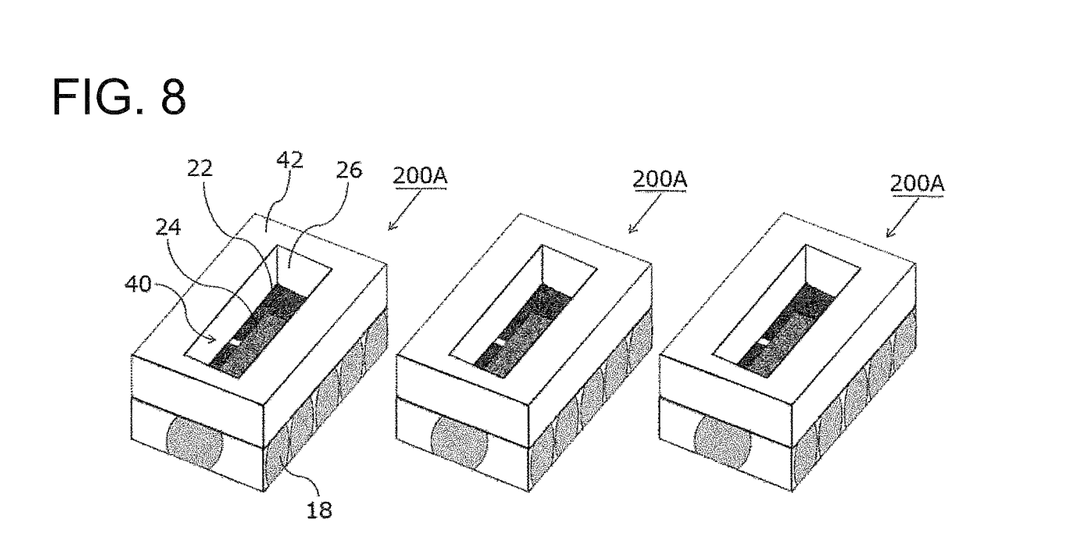
FIG. 8 is a schematic diagram illustrating a light emitting device according to the second embodiment of the present disclosure.

The light emitting device assembly 130A is cut along predetermined cutting lines and thus singulated, to obtain light emitting devices 200A as shown in FIG. 8. In the example shown in FIG. 8, cutting is performed so that each light emitting device 200A has one recess 40. Cutting may be performed so that each light emitting device 200A has two or more recesses.

Third Embodiment

A light emitting element mounting base member according to the present embodiment further includes at least one protection device 50 that is electrically connected to at least one electrical conductor core 12A and embedded in a light blocking resin 20A.

Arranging Core Members 16A

Figure 9:
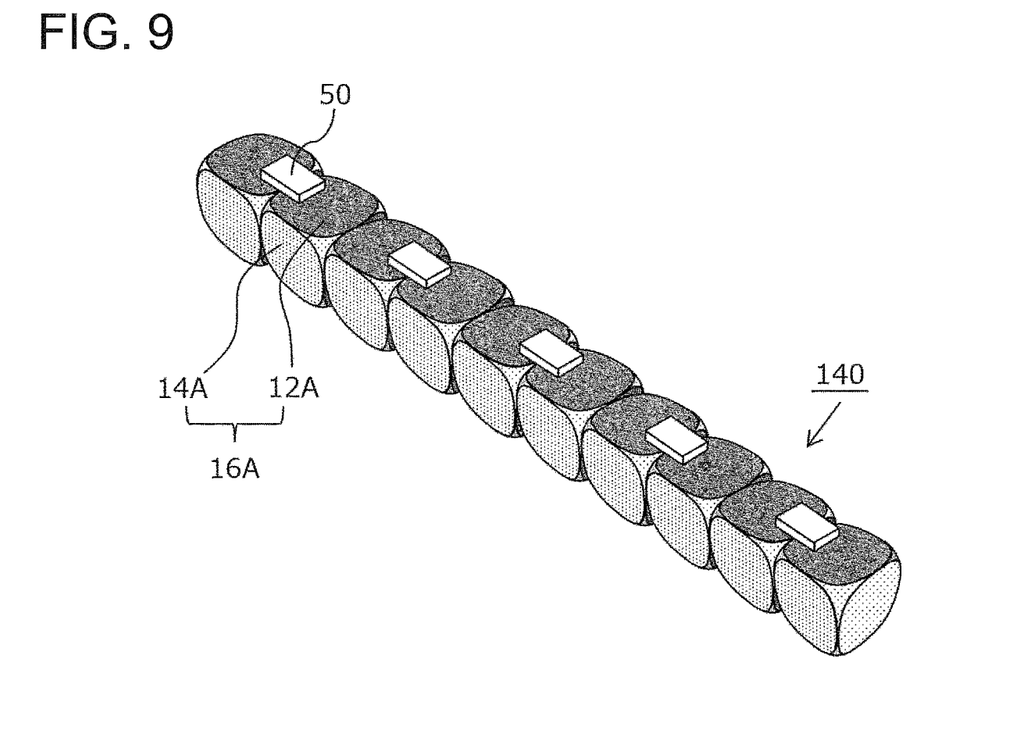
FIG. 9 is a schematic diagram illustrating a manufacturing method according to a third embodiment of the present disclosure.

In the present embodiment, as shown in FIG. 9, cuboid core members 16A are linearly arranged, to form a bar-like one-dimensional array metal core assembly 140. The cuboid core members 16A can be formed, for example, by aligning the spherical core members, and thereafter bringing them into contact with one another by pressurizing from three directions, namely, the top-bottom direction, the front-rear direction, and the right-left direction. Each core member 16A has an electrical conductor core 12A, and a light-reflecting insulating member 14A that covers the surface of the electrical conductor core 12A. In a region where the core member 16A is electrically connected to the protection device 50, the electrical conductor core 12A is exposed from the insulating member 14A. For example, the electrical conductor core 12A is exposed by removing the insulating member 14A at one lateral surface of the one-dimensional array metal core assembly 140. Instead of removing the insulating member 14A, the electrical conductor cores 12A and the protection devices 50 may be electrically connected one another by piercing bumps provided on the protection devices 50 and breaking the insulating member 14A.

Mounting Protection Device

As shown in FIG. 9, the protection devices 50 are flip-chip mounted at predetermined positions where the electrical conductor cores 12A are exposed. Here, the protection devices 50 are mounted so that one protection device 50 is positioned across the joining surfaces of the adjacent core members 16A, and the protection device 50 is joined to the electrical conductor cores 12 with two electrodes of the protection device 50. The electrical connection between the protection device 50 and the electrical conductor cores 12 may be performed with solder, anisotropic conductive paste, bumps or the like.

Arranging Insulating Spacer Member 18A

Figure 10:
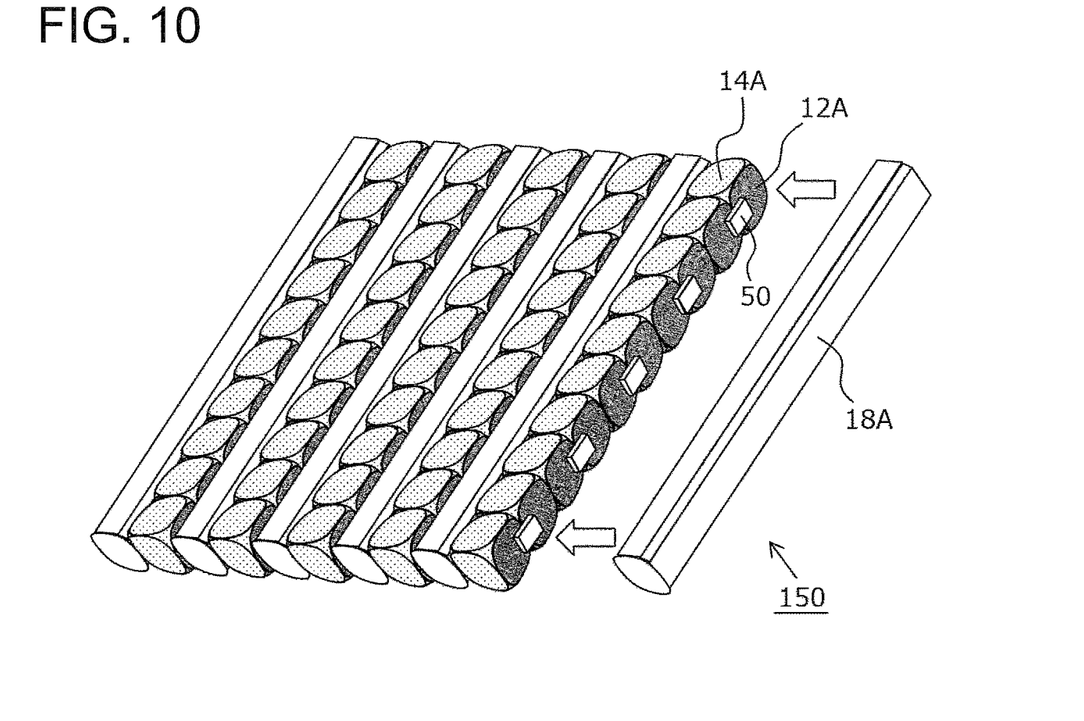
FIG. 10 is a schematic diagram illustrating the manufacturing method according to the third embodiment of the present disclosure.

As shown in FIG. 10, the one-dimensional array metal core assemblies 140 and the insulating spacer members 18A are alternately aligned and joined. Thus, a planar array metal core assembly 150 is formed. At this time, the protection devices 50 are positioned between the lateral surface of the one-dimensional array metal core assembly 140 and the lateral surface of the insulating spacer member 18A. That is, the joining is performed so that the protection devices 50 are aligned on the lateral surface, but not on the upper surface or the lower surface. Recesses for housing the protection devices 50 may be formed on the lateral surface of each insulating spacer member 18A.

Forming Light Blocking Resin

Subsequently, By using a mold that has a substantially rectangular parallelepiped-shaped cavity to cover the planar array metal core assembly 150, a light blocking resin composition is injected into the mold to form the light blocking resin. Thus, a base member preparatory body is formed that encloses the planar array metal core assembly 150 in the light blocking resin 20A. At this time, the space between the core members 16A and the insulating spacer members 18A where no protection device 50 is present serves as the flow path of the resin composition, and also forms the anchor.

Figure 11:
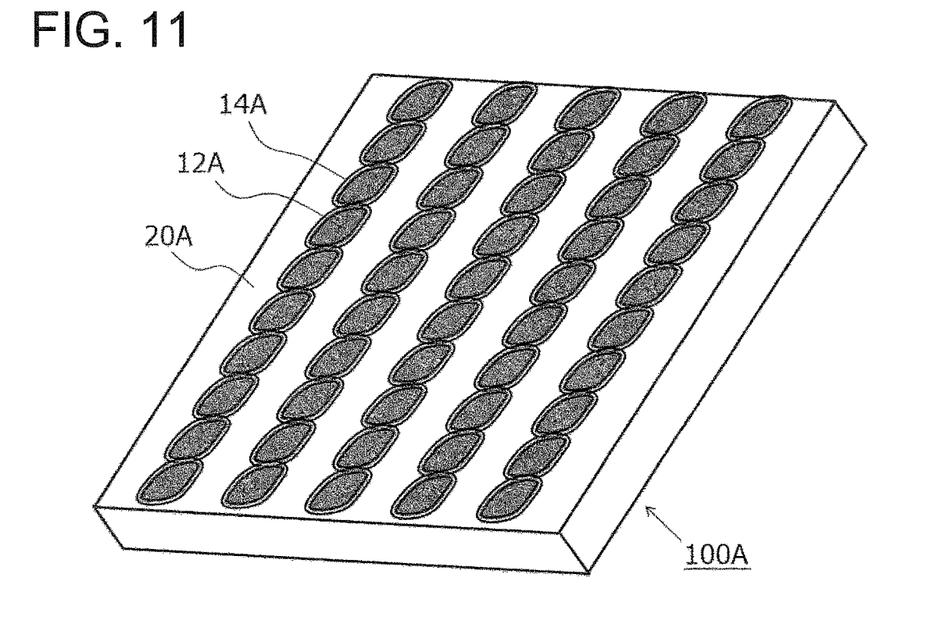
FIG. 11 is a schematic diagram illustrating the manufacturing method according to the third embodiment of the present disclosure.

Thereafter, the base member preparatory body has a thickness reduced to a predetermined degree by grinding or polishing performed at its upper and lower surfaces. Thus, the light blocking resin 20A and the insulating members 14A are partially removed, to expose the electrical conductor cores 12A at the upper and lower surfaces. Consequently, as shown in FIG. 11, the light emitting element mounting base member 100A is obtained. The following operations are similar to those in the first and second embodiments.

According to the present embodiment, the protection devices 50 are enclosed in the light emitting element mounting base member 100A, and therefore light emitted by the light emitting elements are not be absorbed by the protection devices 50, thereby preventing a reduction in light emission efficiency of the light emitting devices.

Hereinafter, a description will be given of materials and the like suitable for the constituent members of the light emitting device according to the embodiments.

Core Member

The core member at least includes the electrical conductor core and the light-reflecting insulating member. The core member is, for example, a metal core equipped with a light-reflecting insulating film, a metal sphere equipped with a light-reflecting insulating film or a graphite sphere equipped with a light-reflecting insulating film. The surface of the core member may have a fine irregular shape in order to enhance joining strength with the light blocking resin.

Electrical Conductor Core

The electrical conductor core is a member used as the electrode and/or the heat dissipation path of the light emitting device. For this purpose, the electrical conductor core may be made of an electrically conductive material such as metal. For example, the material of the electrical conductor core may be metal such as Cu, Al, Ag, Au, Pt, Pd, or Rh or alloy thereof, or a carbon material such as graphite. The electrical conductor core preferably reflects light emitted by the light emitting element mounted on the light emitting element mounting base member, for example, by 70%, and preferably by 80% or more. For example, in the case where the light emitting element emits blue or bluish light, the electrical conductor core is preferably made of Al, Ag or the like.

The electrical conductor core may be entirely in a single composition, or may have a plurality of regions differing in composition. For example, the electrical conductor core may have a multilayer structure in which two or more types of materials are included to form a first metal part covered with a second metal part by plating or the like. The electrical conductor core may contain an insulating material or member such as voids. The electrical conductor core may be made of an anisotropic conductive material, such as a stranded wire or a litz wire.

The shape of the electrical conductor core may be, for example, a cylindrical column, a prism (or a polyhedron), a sphere (including an ellipsoid), a round pipe (or a round tube), or any three-dimensional shape similar to the foregoing. The shape of the electrical conductor core is selected as appropriate depending on the structures provided in the light emitting element mounting base member, such as a through hole or a castellation.

The electrical conductor core is partially exposed outside the surfaces (i.e., the upper surface 31 and the lower surface 32) of the light emitting element mounting base member. At the exposed portion, the electrical conductor core is electrically connected to the light emitting element using a joining member such as a wire or solder. Accordingly, the electrical conductor core preferably has the size or the shape which allows the exposed portion to have the area and shape suitable for establishing connection with the light emitting element. For example, the electrical conductor core is exposed to be substantially flush with the upper surface and the lower surface of the light emitting element mounting base member. In the case where the metal film described later is provided in such a manner as to cover the exposed portion of the electrical conductor core, the metal film and the light emitting element are connected to each other via a joining member.

The light emitting element that is mounted on the light emitting element mounting base member may be in contact with any of the electrical conductor core, the light-reflecting insulating member, and the light blocking resin. The light emitting element being mounted on the electrical conductor core facilitates dissipation of heat generated by the light emitting element. The electrical conductor core and the electrode of the light emitting element can be directly connected to each other via an electrically conductive joining member such as solder without using wires, thereby achieving a reduction in size of the light emitting device.

One light emitting element mounting base member is provided with a plurality of core members in order for the electrical conductor cores to serve as the electrodes of the light emitting device. At least two electrical conductor cores should be provided to the base member of the light emitting device to serve as the electrodes of the light emitting device. Further, a plurality of electrical conductor cores may be used as one electrode of the light emitting device. For example, the electrode of the light emitting element may be joined with the electrical conductor cores disposed adjacent to each other via an electrically conductive joining member. The disposition of the electrically conductive portion in the light emitting element mounting base member can be changed as appropriate by changing the positioning of the core members each having the electrical conductor core. This improves flexibility in designing the light emitting element mounting base member.

The electrical conductor cores are exposed at the upper surface 31 and the lower surface 32 of the light emitting element mounting base member. A single electrical conductor core may be exposed at the two positions, namely, at the upper surface and the lower surface. Alternatively, some of the electrical conductor cores may be exposed at the upper surface and some others may be exposed at the lower surface. Use of the electrical conductor core joined to the light emitting element as the external terminal of the base member improves the heat dissipation property.

In the case where the electrical conductor core is used not as the electrode but as the heat dissipation path, the electrical conductor core and the light emitting element may not be electrically connected to each other, and the electrical conductor core is not necessarily exposed at the surface of the light emitting element mounting base member. The electrical conductor core(s) is/are preferably disposed continuously from around the light emitting element being the heat source to around the outer surfaces of the light emitting element mounting base member, so that heat from the light emitting element is easily released to the outside.

Light-Reflecting Insulating Member

In the present embodiment, the light-reflecting insulating member covers the lateral surface of the electrical conductor core. The light-reflecting insulating member may have a single-layer structure, or a multilayer structure in which a plurality of layers are stacked. In the case of a plurality of layers, a thermosetting resin film can be provided on the side near the electrical conductor core and a joining layer on the outermost perimeter. This can achieve good productivity, because none or little adhesive agent is necessary, in forming the assembly of the core members.

The light-reflecting insulating member is formed, for example on the lateral surface of the electrical conductor core, as a single layer film or a multilayer film in a substantially uniform thickness. The light-reflecting insulating member has a thickness, for example, between several micrometers and several hundred micrometers. The light-reflecting insulating member preferably has a thickness of about several ten micrometers, because both the electrical insulation and a reduction in size of the light emitting device (or the light emitting element mounting base member) can be achieved. The light-reflecting insulating member may be formed in a substantially uniform thickness on the lateral surface of the electrical conductor core. Alternatively, the light-reflecting insulating member may be formed to be thicker at one area than at other area.

A portion of the electrical conductor core exposed outside the upper surface and the lower surface of the light emitting element mounting base member is also exposed from the light-reflecting insulating member. The light-reflecting insulating member is positioned around the electrical conductor core on the upper surface and the lower surface of the base member. The light-reflecting insulating member being interposed between a plurality of electrical conductor cores allows the plurality of electrical conductor cores to be disposed as being insulated from each other.

The light-reflecting insulating member is preferably made of a material using a resin as a base material in view of costs and manufacturability. A resin such as a thermosetting resin or a thermoplastic resin can be employed as the resin for the base material. Specific examples of such a resin include an epoxy resin composition; a silicone resin composition; a modified epoxy resin composition such as a silicone modified epoxy resin; a modified silicone resin composition such as an epoxy modified silicone resin; polyimide resin compositions and modified polyimide resin compositions; polyphthalamides (PPA); polycarbonate resins; liquid crystal polymers (LCP); acrylonitrile butadiene styrene (ABS) resins; phenol resins; acrylic resins; polybutylene terephthalate (PBT) resins; polypropylene resins (PP); polyamides (PA 6 and PA66); polyphenylene sulfide resins (PPS); and polyether ether ketone resins (PEEK). The material of the base material can be selected from materials other than resin, for example, glass.

In order to provide the base material with light reflectivity, a light-reflecting material in shape of, for example, particulate or fibrous. Specific examples of such materials include titanium dioxide, silicon dioxide, zirconium dioxide, potassium titanate, alumina, aluminum nitride, boron nitride, mullite, niobium oxide, or various kinds of rare-earth oxides (e.g., yttrium oxide, gadolinium oxide) may be added to the base material or other member. The light-reflecting insulating member preferably exhibits high reflectivity to light emission wavelength of the light emitting element mounted thereon. For example, the light-reflecting insulating member is preferably set to exhibit the reflectivity on the average of 70% or more to the light emitted by the light emitting element in a range of 440 nm to 630 nm. Further, the light-reflecting insulating member preferably exhibits high average reflectivity than the employed electrical conductor core, in the range of 440 nm to 630 nm.

The light-reflecting insulating member may be formed in such a manner as to partially expose the electrical conductor core in advance. Alternatively, the entire surface of the electrical conductor core may be covered with the light-reflecting insulating member, and thereafter the light-reflecting insulating member may be partially removed, so that the surface of the electrical conductor core is exposed from the insulating member. In the case where the light-reflecting insulating member is removed later, for example, thermosetting resin can be used for the base material of the light-reflecting insulating member, and thermoplastic resin can be used for the light blocking resin. Therefore, the light-reflecting insulating member can be selectively dissolved with a chemical agent using the difference in dissolving speed. In this manner, removal of the light-reflecting insulating member can be performed not only by cutting, but also by dissolving.

Light Blocking Resin

The light blocking resin is an insulating member that integrally holds the plurality of core members. Light blocking means herein that the resin is capable of blocking light from the light emitting element (e.g., mainly visible light) by, for example, 70%, preferably 90%, and further preferably 95% or more. The light-blocking effect may be attained by reflecting light or absorbing light. The light blocking resin can be white or black, for example. This makes the resin base material less likely to degrade due to light.

The light blocking resin may be thermosetting resin, thermoplastic resin or the like. In order to provide such resin with the light blocking property against light emitted by the light emitting element mounted thereon, a light-reflecting material, a light absorbing material or other materials can be added. Such an additive may be particulate, fibrous or other shape. The light blocking resin may be formed by a single material or a plurality of different materials. Further, the light blocking resin may present not only the space between a plurality of core members, but may also project on an upper side or a lower side.

Light emitted to the resin positioned vicinity of the light emitting element (in particular, at the position in contact with the light emitting element or the position facing the light emitting element) is extremely high in density. As the light emitting device drives, the light may cause degradation or discoloration of the resin, thereby reducing the light emission efficiency of the light emitting device. Providing light blocking property to the resin positioned immediately below the light emitting element discourages deterioration of the resin due to light, and maintains the light emission efficiency of the light emitting device.

A resin such as a thermosetting resin or a thermoplastic resin can be employed as the resin for a base material of the light-blocking resin. Specific examples of such a resin include an epoxy resin composition; a silicone resin composition; a modified epoxy resin composition such as a silicone modified epoxy resin; a modified silicone resin composition such as an epoxy modified silicone resin; a polyimide resin composition, a modified polyimide resin composition;

polyphthalamide (PPA); a polycarbonate resin; liquid crystal polymer (LCP); ABS resin; phenolic resin; acrylic resin; PBT resin; polypropylene resin (PP); polyamide (PA6, PA66); polyphenylene sulfide resin (PPS); and polyether ether ketone resin (PEEK).

A light-reflecting material is preferably added to such resin. To serve as the light-reflecting material, powder of a reflecting member that is less likely to absorb light from the light emitting element and is largely different in refractive index from the resin serving as the base material (e.g., $TiO_2$, $Al_2O_3$, $ZrO_2$, or $MgO$) may be dispersed. Thus, light can be efficiently reflected.

Reflector

The reflector may include the material similar to that of the light blocking resin described above. Similarly to the light blocking resin, the material preferably contains a light-reflecting material. The reflector may include a dielectric multilayer film, or a multilayer film made up of an insulating film and a metal film.

Metal Film

On the surface of the electrical conductor core exposed at the upper surface and the lower surface of the light emitting element mounting base member, the metal film may be formed by plating or the like. The metal film on the upper surface of the light emitting element mounting base member, which is a side where the light emitting element is mounted, is preferably made of metal being highly reflective to light emitted by the light emitting element. The metal film on the lower surface of the light emitting element mounting base member serving as the external electrode of the light emitting device is preferably made of metal that is good in wettability to solder. In consideration of adhesion between the outermost metal film and the electrical conductor core, the metal film may include a metal film serving as a base layer. That is, the metal film may have a multilayer structure.

The metal film may be formed not only on the surface of the electrical conductor core, but also on the surface of the light-reflecting insulating member and/or the light blocking resin. For example, on at least one electrical conductor core on which the light emitting element is mounted, the metal film is formed across the surface of the electrical conductor core exposed at the surface of the light emitting element mounting base member and the surface of the insulating member and that of the light blocking resin positioned outside the electrical conductor core. Provision of such a metal film allows heat from the light emitting element to spread in the lateral direction of the base part of the light emitting device.

The metal film may function as a wiring layer that electrically connects two or more electrical conductor cores to each other. For example, so as to connect between adjacent electrical conductor cores, respective surfaces of the electrical conductor cores and the insulating members and the light blocking resin positioned between the adjacent electrical conductor cores are covered with the metal film. Thus, a serial or parallel wiring can be formed, and flexibility in designing the base member of the light emitting device improves. For example, when a plurality of light emitting elements are connected in series with the increased drive voltage and the reduced drive current, the voltage drop or power loss is less likely to occur, thereby improving the energy efficiency as the light source improves.

The metal film may be provided after the formation of the light blocking resin. Alternatively, the metal film may be provided to the electrical conductor core before the formation of the light blocking resin.

Light Emitting Element

Examples of the light emitting element that can be mounted on the light emitting element mounting base member include a light emitting diode, a laser diode, a light emitting transistor, and a light emitting thyristor.

The light emitting element is preferably mounted on the exposed surface of the electrical conductor core in view of heat dissipation. An insulating member having good thermal conductivity or a thin insulating film may be provided between the light emitting element and the electrical conductor core. For example, the light emitting element using an insulating substrate such as a sapphire substrate can be junction-up mounted on the exposed surface of the electrical conductor core.

In the case where the flip-chip mounting (also referred to as the junction-down mounting) is performed, at least the pair of electrodes of the light emitting element is preferably electrically connected to two or more electrical conductor cores. In the case where bending stress is applied to the base part of the light emitting device, the bending stress tends to concentrate not on the metal portion but on the resin portion that easily deforms than the metal portion. Accordingly, in performing the flip-chip mounting, bending stress concentrating on the insulating part present near the light emitting element may break the light emitting element, disconnect or crack the conductive connecting member such as solder or bumps, thereby possibly leading non-lighting of the light emitting element. By arranging a plurality of electrical conductor cores near the light emitting element, the light emitting element mounting part of the base part of the light emitting device and the surrounding part are formed by a plurality of light-reflecting insulating members or the light blocking resin. Therefore such resin parts disperse the bending stress, and the bending stress is less likely to concentrate on the region around the light emitting element. As a result, the present embodiment can reduce light emitting device failures, such as non-lighting, due to external stress applied to the base part.

Further, as compared to a frame-insert type light emitting element mounting base member, the interval between the adjacent light emitting device housings is narrow. Accordingly, in an assembly of the light emitting device housings, the interval between the light emitting element mounting parts can be narrowed. Thus, the processing capacity of the chip mounter can be increased, to reduce the assembling costs.

Insulating Spacer Member

The light emitting element mounting base member according to the present embodiment may further include the insulating spacer member. By disposing the spacer member between the core member and the core member, the distance between the core members can be set. This enhances flexibility in designing the light emitting element mounting base member or the light emitting device.

The insulating spacer member may be made of the material similar to that of the light-reflecting insulating member. Using a resin material, grinding, cutting, (i.e., singulating) and the like can be easily performed. Further, the shape can be determined as appropriate depending on the design of the light emitting element mounting base member to be obtained. For example, the shape may be a cylindrical column, a prism (a polyhedron), a sphere (including an ellipsoid), a round pipe (a round tube), or any shape similar to the foregoing. Further, a joining layer may be provided to the outermost perimeter. In order to enhance the joining force to the light blocking resin, the insulating spacer member may have fine irregular surfaces.

Other than being spherical, the insulating spacer member may be linear in shape depending on the distance desired to be adjusted, such as square bar-like or round bar-like shape. Further, the insulating spacer member may be film-like, or sheet-like with a certain thickness.

Protection Device

The light emitting device may include the protection device that protects the light emitting element from breakdown due to overcurrent. The protection device may be, for example, a Zener diode or a capacitor. The protection device with an electrode on one side is preferable, so that the protection device can be face-down mounted without the necessity of using wires. For example, the protection device is connected to one of the lateral surfaces of the electrical conductor core, and provided inside the light emitting element mounting base member while being covered with the light blocking resin. The insulating member is removed from the connecting part between the protection device and the electrical conductor core. Thus, the protection device can be disposed inside the light emitting element mounting base member. This can reduces the risk of light from the light emitting element being absorbed or blocked by the protection device, thereby enhancing the light extraction efficiency of the light emitting device.

Encapsulating Member

The light emitting device may include the encapsulating member for protecting the light emitting element from external physical and chemical degradation factors. The encapsulating member need only be formed to directly or indirectly cover the light emitting element, and may be made of silicone resin or epoxy resin as a suitable material, for example. In case of an UV-LED, optical glass may be employed.

Other Members

The light emitting device may contain a light scattering member and/or a wavelength conversion member that converts part of light emitted by the light emitting element to light of different wavelength. For example, the encapsulating member may contain a wavelength conversion substance such as a fluorescent material. A resin member such as the light blocking resin may contain filler made of any appropriate substance, to adjust the property such as thermal conductivity or thermal expansion coefficient.

Example 1

As shown in FIG. 1A, a plurality of spherical electrical conductor cores 12 made of Cu and each having a diameter of 0.9 mm are provided. Subsequently, on the entire surface of each of the electrical conductor cores 12, the light-reflecting insulating member 14 is formed, which is silicone resin containing titanium oxide, with a thickness of 0.06 mm. Thus, the core members 16 each having a diameter of 1.02 mm are obtained.

Subsequently, as shown in FIG. 2, the core members 16 and the insulating spacer members 18, which are each a spherical body made of insulating resin and having a diameter of 1 mm, are arranged. Specifically, in the present embodiment, a row in which one insulating spacer member 18 is disposed between core member sets each formed by a plurality of, four in FIG. 2, core members 16 arranged in line, and a row in which only a group of insulating spacer members 18 are disposed, are alternatively repetitively disposed. The core members 16 or the core member sets are used as the lead electrodes of the light emitting devices 200. Then, they are joined to one another to form a core member assembly.

Subsequently, as shown in FIG. 3, using a mold, a light-reflecting molded resin composition made of epoxy resin is molded that contains titanium oxide to cover the core member assembly. This provides the base member preparatory body 120 in which the core member assembly is completely enclosed in the light-reflecting molded resin serving as the light blocking resin 20.

Subsequently, as shown in FIGS. 4, 12, and 13, the obtained base member preparatory body 120 has its thickness reduced to a predetermined degree by grinding or polishing performed at its upper and lower surfaces. Thus, the electrical conductor cores 12 are partially exposed at the upper surface and the lower surface of the base member preparatory body.

Further, as shown in FIG. 5, the metal films 22 are formed on the exposed portions of the electrical conductor cores 12 by plating.

As shown in FIG. 5, a plurality of light emitting elements 24 is mounted on the upper surface of the metal film-equipped light emitting element mounting base member obtained in this manner. In the present embodiment, the light emitting elements 24 each having the pair of positive and negative electrodes at one surface are flip-chip mounted, so that the surface provided with the electrodes faces the metal film-equipped light emitting element mounting base member. The light emitting elements 24 in the present embodiment each have dimensions of 0.85 mm in longitudinal, 0.65 mm in lateral, and 0.15 mm in thickness. At this time, one metal film and the positive or negative electrode of one light emitting element 24 are connected to each other. The connection between the metal film-equipped light emitting element mounting base member and the light emitting element 24 may be performed with solder, anisotropic conductive paste or the like.

Subsequently, as shown in FIG. 5, the light emitting elements 24 and the upper surface of the metal film-equipped light emitting element mounting base member (where the light emitting elements are mounted) are covered and thus encapsulated with a light-transmissive resin serving as the encapsulating member 26, to form the light emitting device assembly 130.

Then, as shown in FIG. 6, the light emitting device assembly 130 is cut with a dicing blade along predetermined cutting lines extending along the rows where only a group of insulating spacer members 18 is disposed, so that the plurality of insulating spacer members 18 and the light-reflecting molded resin serving as the light blocking resin 20 are cut. Thus, the light emitting device assembly 130 is singulated to provide the light emitting devices 200.

Example 2

In order to form the core members, a white-color light-reflecting insulating member is formed with a thickness of 0.06 mm on each of spherical electrical conductor cores made of Cu and having a diameter of 0.9 mm. Thus, the core members each having a diameter of 1.02 mm is obtained. As shown in FIG. 9, the core members are linearly aligned, and brought into contact with one another by being pressurized from three directions, to form the bar-like one-dimensional array metal core assembly 140. By being pressurized, each of the electrical conductor cores in state of copper spheres becomes cuboid in shape.

The insulating members 14A is removed on one lateral surface of the one-dimensional array metal core assembly 140. On the predetermined positions where the insulating members 14A have been removed, Zener diodes serving as the protection devices 50 are flip-chip mounted.

Subsequently, as shown in FIG. 10, the one-dimensional array metal core assemblies 140 and the insulating spacer members 18A are alternately aligned and joined. Thus, the planar array metal core assembly 150 is formed. The insulating spacer members 18A are each 0.67 mm square, and have a length substantially the same as that of the one-dimensional array metal core assemblies 140.

In the insert molding technique, the planar array metal core assembly 150 is clamped and pressed with a mold to form the light blocking resin 20A using a light-reflecting thermoplastic resin composition. Thus, the base member preparatory body that encloses the planar array metal core assembly 150 is obtained. The base member preparatory body has a thickness reduced to a predetermined degree by grinding or polishing performed at its upper and lower surfaces. Thus, the metal core surfaces are exposed at the upper and lower surfaces, and the light emitting element mounting base member 100A as shown in FIG. 11 is formed.

On the exposed respective upper and lower surfaces of the electrical conductor cores 12A, electroplating is performed to form metal films 22, therefore, the metal film-equipped light emitting element mounting base member is formed. Plating on the upper surfaces on which the light emitting elements are mounted is performed with light-reflecting material, such as Ag.

On one surface of the metal film-equipped light emitting element mounting base member, light emitting elements each having the pair of positive and negative electrodes positioned at one surface are each face-down mounted on a predetermined pair of plated electrical conductor cores 12A. Each of the light emitting elements has dimensions of 0.85 mm in longitudinal, 0.65 mm in lateral, and 0.15 mm in thickness.

The interval between the pair of positive and negative electrodes is 0.14 mm. The upper surface of the metal film-equipped light emitting element mounting base member on which the light emitting elements 24 are mounted is covered and thus encapsulated with the encapsulating member 26 made of a light-transmissive resin. Thus, the light emitting device assembly 130A is formed. Finally, the light emitting device assembly 130A is cut with a mold along predetermined cutting lines and thus singulated, to provide the light emitting devices 200.

The present disclosure is applicable to various kinds of light sources, as a base member of a light emitting device that includes at least one light emitting element such as an LED chip.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting device using a light emitting element mounting base member for mounting a light emitting element having an n-side and a p-side electrode on a same side of the light emitting element, the method comprising:
    arranging a plurality of core members, each of which includes an electrical conductor core and a light-reflecting insulating member provided on a surface of the electrical conductor core, the light-reflecting insulating member having a reflectivity of 70% or more to light emission wavelength of the light emitting element in a range of 440 nm to 630 nm;
    integrally holding the plurality of core members with a light blocking resin that is capable of blocking light from the light emitting element by reflecting or absorbing the light, the light blocking resin being capable of blocking 70% or more of the light in the range of 440 nm to 630 nm;
    partially removing the light-reflecting insulating members to expose a part of each of the electrical conductor cores from the light blocking resin by grinding or polishing the plurality of core members at upper and lower portions of the light-reflecting insulating members;
    forming a metal film on a surface of a part of each of the electrical conductor cores exposed from the light blocking resin; and
    establishing electrical connection between the light emitting element mounting base member and the n-side and p-side electrodes of the light emitting element.

2. The method of manufacturing the light emitting device according to claim 1,
    wherein positions of the plurality of core members are adjusted using insulating spacer members in the arranging step.

3. The method of manufacturing the light emitting element device according to claim 1,
wherein the light-reflecting insulating members are made of resin selected from the group consisting of an epoxy resin composition; a silicone resin composition; a modified epoxy resin composition; a modified silicone resin composition; polyimide resin compositions and modified polyimide resin compositions; polyphthalamides; polycarbonate resins; liquid crystal polymers; acrylonitrile butadiene styrene resins; phenol resins; acrylic resins; polybutylene terephthalate resins; polypropylene resins; polyamides; polyphenylene sulfide resins; and polyether ether ketone resins and mixture thereof.

4. The method of manufacturing the light emitting element device according to claim 1,
wherein the light-reflecting insulating members are made of material using glass as a base material.

\* \* \* \* \*